United States Patent [19]

Lur et al.

[11] Patent Number: 5,427,974
[45] Date of Patent: Jun. 27, 1995

[54] METHOD FOR FORMING A CAPACITOR IN A DRAM CELL USING A ROUGH OVERLAYER OF TUNGSTEN

[75] Inventors: Water Lur, Taipei; Chang-Shyan Kao, Hsing-Juang; Peter Y. Lin, Gong Goan Shiang, all of Taiwan

[73] Assignee: United Microelectronics Corporation, Hsin-Chu, Taiwan

[21] Appl. No.: 214,602

[22] Filed: Mar. 18, 1994

[51] Int. Cl.⁶ .................... H01L 21/70; H01L 21/469
[52] U.S. Cl. .................... 437/60; 437/233; 437/919; 437/977; 148/DIG. 14; 148/DIG. 138
[58] Field of Search .............. 437/919, 977, 52, 233, 437/47, 60; 148/DIG. 14, DIG. 138

[56] References Cited

U.S. PATENT DOCUMENTS

| | | | |
|---|---|---|---|
| 4,859,622 | 8/1989 | Eguchi | 437/919 |
| 5,068,199 | 11/1991 | Sandhu . | |
| 5,110,752 | 5/1992 | Lu . | |
| 5,134,086 | 7/1992 | Ahn et al. . | |
| 5,158,905 | 10/1992 | Ahn | 437/233 |
| 5,164,881 | 11/1992 | Ahn . | |
| 5,182,232 | 6/1993 | Chhabra et al. . | |
| 5,204,280 | 4/1993 | Dhong et al. | 437/919 |
| 5,213,992 | 5/1993 | Lu . | |
| 5,227,322 | 7/1993 | Ko et al. | 437/919 |
| 5,244,842 | 9/1993 | Cathey et al. | 437/919 |
| 5,254,503 | 10/1993 | Kenney | 437/52 |
| 5,256,587 | 11/1993 | Jun et al. . | |
| 5,302,540 | 4/1994 | Ko et al. | 437/919 |
| 5,304,828 | 4/1994 | Kim et al. . | |
| 5,308,786 | 5/1994 | Lur et al. . | |
| 5,313,100 | 5/1994 | Ishii et al. . | |
| 5,332,696 | 6/1994 | Kim et al. | 437/233 |
| 5,342,800 | 8/1994 | Jun | 437/919 |
| 5,350,707 | 9/1994 | Ko et al. | 437/52 |

FOREIGN PATENT DOCUMENTS 3266460 3/1990 Japan .
2-308551 12/1990 Japan .

OTHER PUBLICATIONS

Y. K. Jun et al., IEEE Electron Device Letters, vol. 13, #8, Aug. 1992.
S. Wolf & R. N. Tauber, Silicon Processing for the VLSI ERA, vol. I, Lattice Press, 1986, pp. 400–401, 581.

*Primary Examiner*—Brian E. Hearn
*Assistant Examiner*—Leon Radomsky
*Attorney, Agent, or Firm*—Meltzer, Lippe, Goldstein

[57] ABSTRACT

In accordance with the invention a rough overlayer, e.g., a tungsten film, is used to define a plurality of pillars in a polysilicon electrode layer. This increases the surface area of the polysilicon electrode and thus increases capacitance of a capacitor incorporating the electrode layer in a DRAM cell.

6 Claims, 3 Drawing Sheets

METHOD FOR FORMING A CAPACITOR IN A DRAM CELL USING A ROUGH OVERLAYER OF TUNGSTEN

FIELD OF THE INVENTION

The present invention relates to a technique for forming a modulated stacked capacitor for use in a Dynamic Random Access Memory (DRAM) cell.

BACKGROUND OF THE INVENTION

A DRAM cell typically comprises a MOS transistor and a capacitor. An example of such a DRAM cell is shown in FIG. 1. The DRAM cell 10 of FIG. 1 comprises the MOSFET 12 and the capacitor 14. A word line is connected to the gate of the MOSFET 14. A bit line is connected to the source of the MOSFET 12. The capacitor 14 is connected to the drain of the MOSFET 12. The state of the DRAM cell 10 is determined by whether or not the capacitor 14 is holding a charge.

The DRAM cell is read by using the bit line to determine whether or not a charge is stored in the capacitor. The DRAM cell is written by using the bit line to add or remove charge from the capacitor. However, the cell can only be read or written when the cell is addressed (i.e. activated) by the word line.

With the continuous advancement of DRAM technology, the chip area used for one DRAM cell is getting smaller. There are two methods used to increase the capacitance of the capacitor in the DRAM cell. One method is to decrease the effective dielectric thickness and the other method is to increase the effective capacitor surface area.

It is expected that future scaled DRAM cells will rely heavily on the quality and storage capacity of ultra thin dielectric materials that are sandwiched between two heavily doped polysilicon and/or silicon electrodes. However, higher capacitance values cannot be obtained without seriously degrading the device retention time. Specifically, films thinner than 50 angstroms present excessive leakage current due to direct carrier tunneling. For a given capacitor dielectric film, the larger the surface area, the larger the capacitance.

FIGS. 2,3,4,5 and 6 illustrate prior art DRAM cells. The DRAM cell 20 of FIG. 2 comprises a MOSFET 22 and a capacitor 24 which are both formed on a silicon substrate 25. The MOSFET 22 comprises the source and drain regions 26 and 28, which regions are separated by the channel 29. It should be noted that the source and drain regions 26, 28 have a conductivity type opposite to that of the substrate. A metal contact 27 directly contacts the source region 26. A gate 30 is formed from polysilicon material (Poly-1) and is separated from the surface of the substrate by an oxide layer 31. An additional oxide region 32 is on top of the gate 30.

The capacitor 24 sits on top of the drain region 28. The capacitor 24 has a first electrode 40 formed by a conducting polysilicon material (poly-2), a thin dielectric layer 42 which may be NO or ONO, and a second electrode 44 which is formed from a conducting polysilicon material (poly-3). The capacitor contacts the drain region 28 in a space between the oxide region 32 and the oxide region 52.

FIG. 3 shows a DRAM cell 20' which is similar to the DRAM cell 20 of FIG. 2. The main difference is that the shape of the poly-2 electrode layer 40, dielectric layer 42 and poly-3 electrode layer 44 have been altered to increase the surface area of the capacitor 24.

FIG. 4 shows a DRAM cell 20" in which the poly-2 electrode 40 has been made rugged to increase the surface area of the capacitor.

FIG. 5 shows a DRAM cell 20''' in which the polysilicon electrode 40 is formed from a plurality of horizontal layers 41 to increase the surface area of the capacitor.

Another capacitor structure which can be used to increase the capacitance of a DRAM cell is known as MOST (modulated stacked) capacitor. (See e.g. Y. K. Jun et al, "The Fabrication and Electrical Properties of Modulated Stacked Capacitor for Advance DRAM Applications" IEEE Electron Device Letters, Vol. 13, No. 8, Aug. 1992, the contexts of which are incorporated herein by reference).

A DRAM cell 20'''' having a MOST capacitor structure is illustrated in FIG. 6. In the capacitor 24 of FIG. 6, the poly-2 electrode 40 comprises a plurality of spaced apart vertical pillars 43. The capacitor dielectric 42 and poly-3 electrode 44 are then deposited over the spaced apart vertical pillars 43. In this manner a capacitor with a large effective surface area is formed in a DRAM cell.

It is an object of the present invention to provide a technique for manufacture of a MOST capacitor for use in a DRAM cell.

SUMMARY OF THE INVENTION

In accordance with the invention a rough overlayer, e.g., a tungsten film, is used to define a plurality of pillars in a polysilicon electrode layer. This increases the surface area of the polysilicon electrode and thus increases capacitance of a capacitor incorporating the electrode layer.

DETAILED DESCRIPTION OF THE INVENTION

Figure 1:
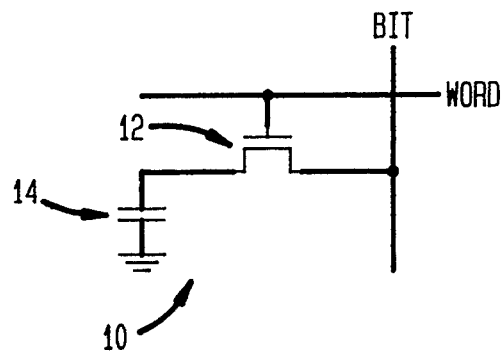
FIG. 1 schematically illustrates DRAM cell.
Figure 2:
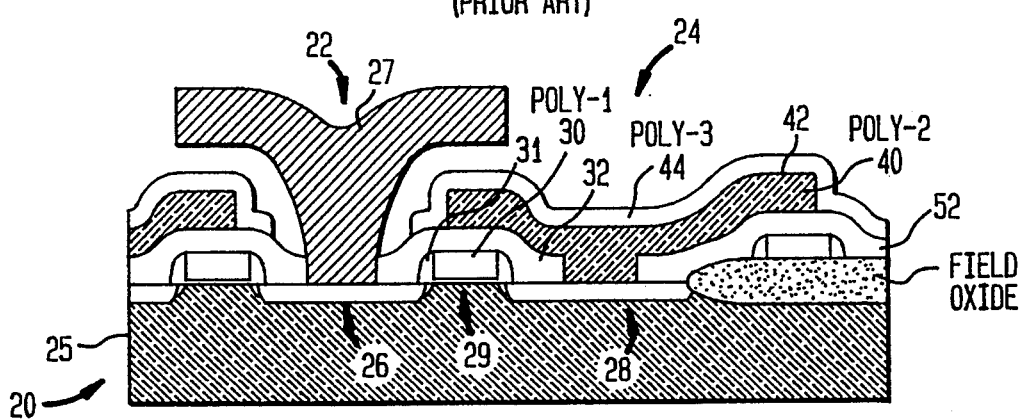
FIGS. 2–6 illustrate various prior art capacitors utilized in DRAM cells.
Figure 3:
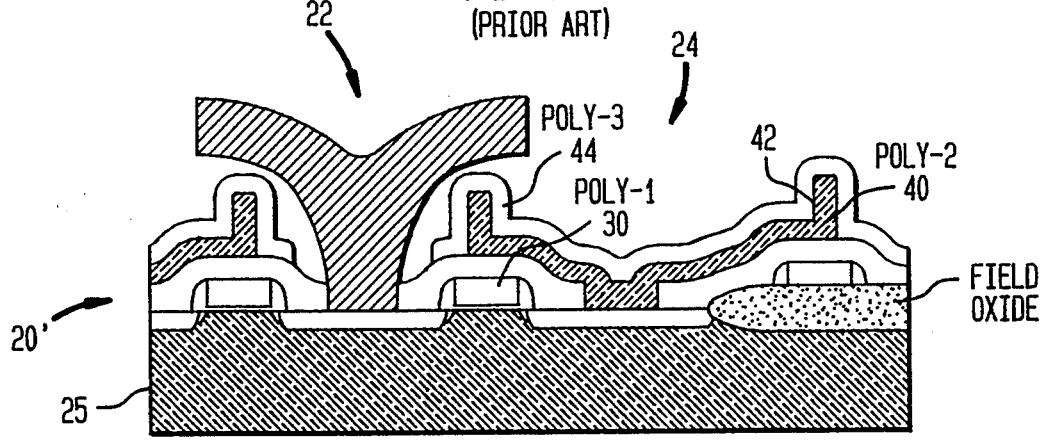
Figure 4:
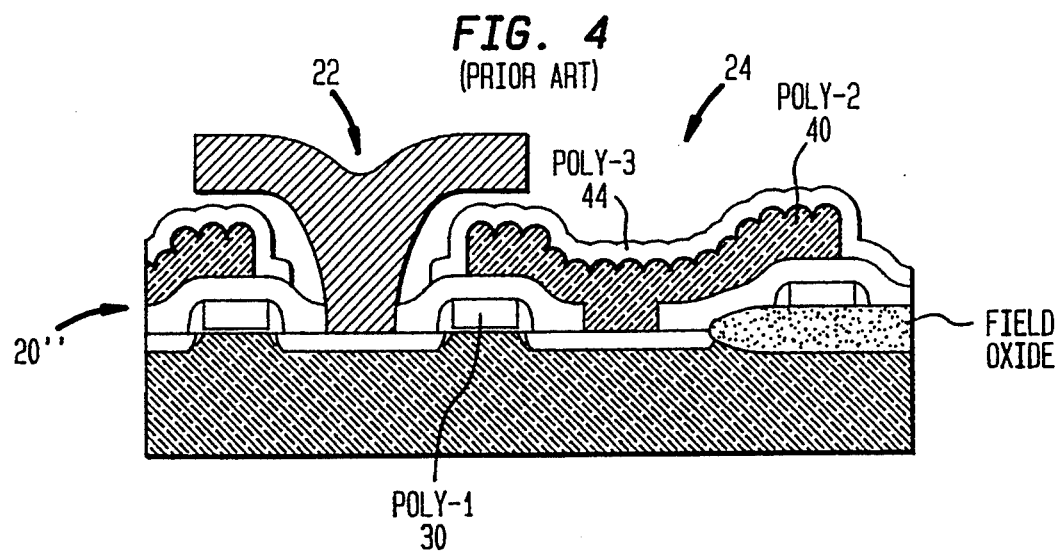
Figure 5:
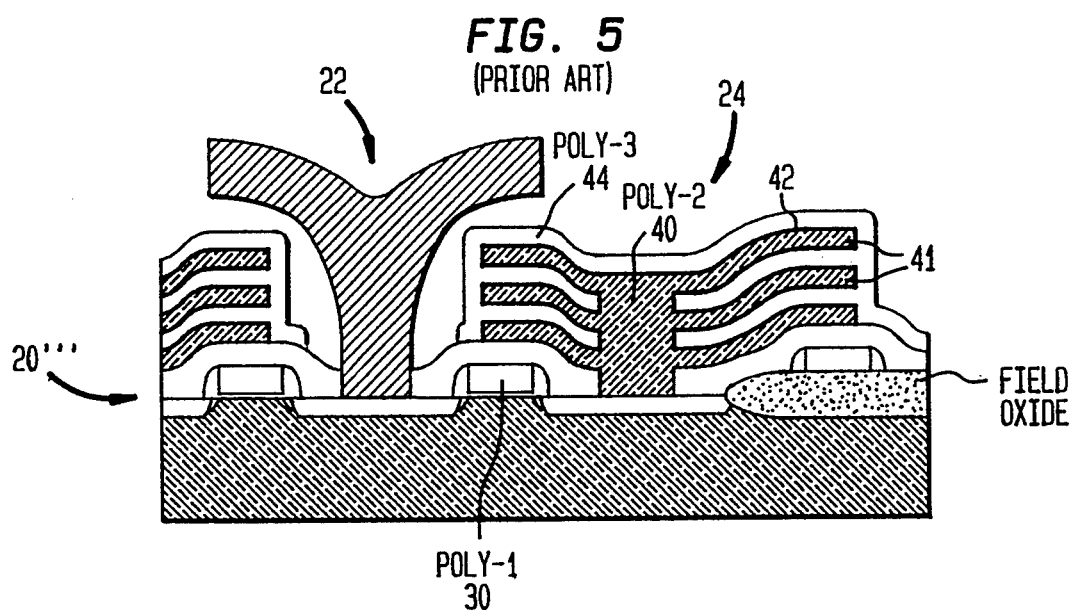
Figure 6:
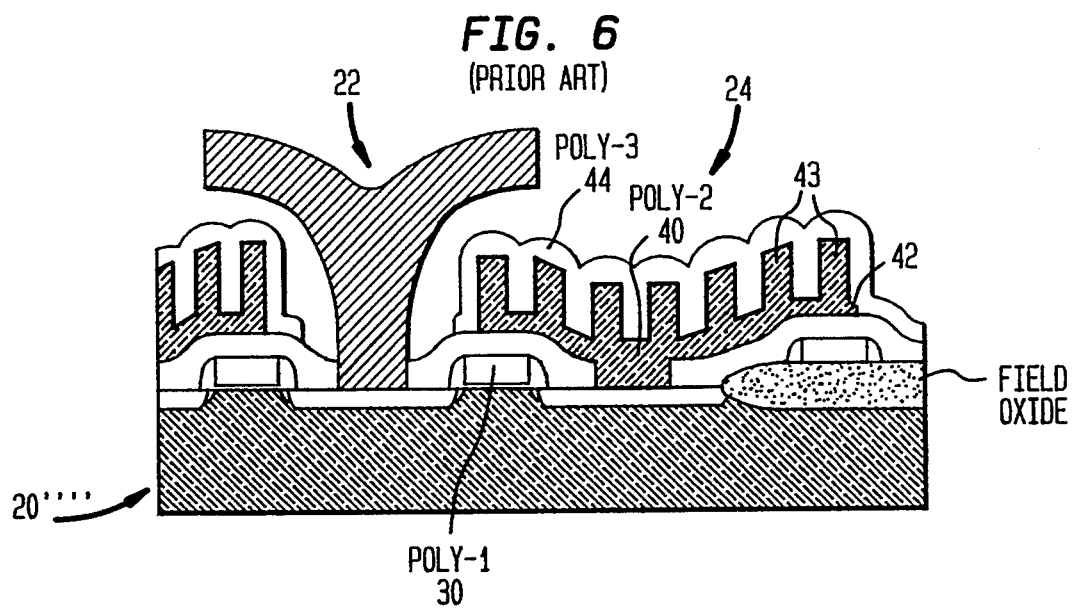
Figure 7A:
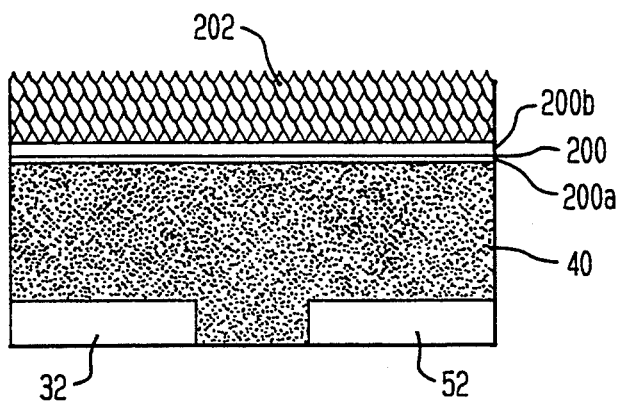
FIGS.7(a), 7(b), 7(c), and 7(d) illustrate a technique for forming a MOST capacitor for use in a DRAM cell in accordance with the present invention.

An MOST capacitor for use in a DRAM is formed in accordance with an illustrative embodiment of the invention as follows:

1. As shown in FIG. 7(a), a polysilicon electrode layer 40 is deposited on a silicon substrate. Specifically, the polysilicon electrode layer 40 is deposited over the drain region 28 of an FET (see FIGS. 2–6) and over the oxide regions 32, 52. The polysilicon layer 40 has a thickness of 5000–10,000 Angstroms and is deposited by chemical vapor deposition or the like after the formation of poly contacts.

2. The polysilicon electrode layer 40 is doped with $POCl_3$ or ion implanted with phosphorous or arsenic or the like to become conductive.

3. A thin Ti/TiN composite layer 200 (i.e. a composite layer having a first layer 200a made of Ti and a second layer 200b made of TiN) is deposited on he polysilicon layer 40. The Ti layer has a thickness of 100–500 Angstroms and the TiN layer has a thickness of 600–2000 Angstroms. The Ti/TiN composite layer 200 is then treated at a temperature of 750°

C. to 900° C. for twenty seconds to ten minutes to act as a glue layer for a subsequent tungsten film deposition and to act as an end point for subsequent tungsten film etching.

4. A tungsten overlayer 202 is deposited by chemical vapor deposition to a thickness between 4000 and 10,000 Angstroms at a temperature of between 380° C. to 600° C. The surface morphology is moderately rough due to this step.

Figure 7B:
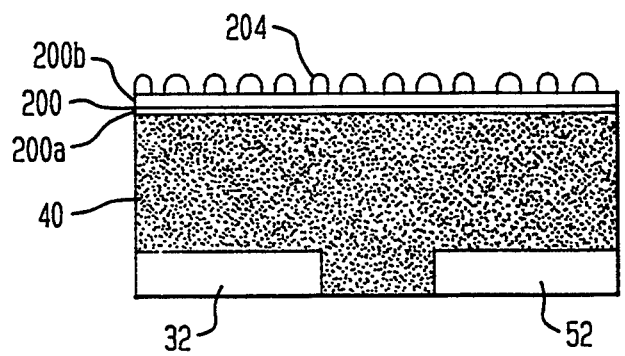

5. The tungsten layer 202 is then reactive ion etched using fluorine-based chemicals such as $SF_6$ until the TiN layer 200(b) is reached. As shown in FIG. 7(b), a plurality of Tungsten residual islands 204 with a size between 0.02 to 0.3 microns are left on the TiN film 200b. The tungsten residual islands 204 are not equally sized or equally spaced.

Figure 7C:
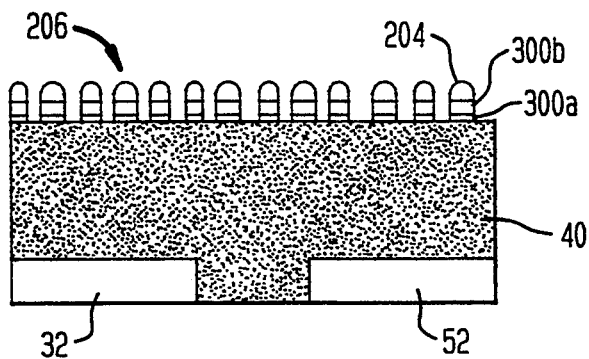

6. The tungsten residues 204 are then used to etch the underlying Ti/TiN films 200a, 200b to form a plurality of islands 206 as shown in FIG. 7(c). Each of the islands 206 includes a Tungsten residue 204, a Ti portion 300a and a TiN portion 300b. The etching agent is a chlorine based chemical such as $BCl_3$, $Cl_2$. Each island 206 has a width of 0.02 to 0.3 microns.

Figure 7D:
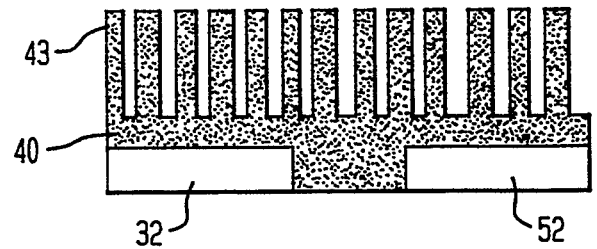

7. Using the islands 206 as a mask, the polysilicon electrode layer 40 is then reactively ion etched to a depth of 4000–8000 Angstroms to form a plurality of polysilicon pillars with diameters between 0.02 to 0.3 microns. The residual islands 206 are then stripped away with $NH_4OH$ and $H_2O_2$ solution. The result is the pillars 43 shown in FIG. 7(d). Preferably, the pillars have a size (0.02 to 0.3 microns) which is smaller than any feature size in the wafer containing the electrode layer 40.

8. A capacitor dielectric layer 42 (see FIG. 6) is then formed on the modulated surface of the polysilicon electrode layer 40. The dielectric layer may be ON or ONO and deposited by CVD, PVD or thermal treatments.

9. The dielectric layer 42 and polysilicon electrode layer 40 are etched to isolate the capacitor.

10. A second polysilicon electrode 44 (see FIG. 6)is deposited over the dielectric layer 42 and etched to complete the capacitor.

11. Another dielectric layer (not shown) usually borophosphosilicate glass (BPSG) or the like is deposited on top of the second polysilicon electrode 44 and the rest of the structure. The BPSG is then patterned so that the metalization (e.g. contact 27) may be formed.

12. The metal layer is then deposited and etched to complete a DRAM structure.

It should be noted that in particular embodiments of the invention, the Ti/TiN film 200 can be omitted so long as the native oxide on the polysilicon layer 40 is removed. If the native oxide is removed, the tungsten overlayer 202 can be deposited directly on the polysilicon electrode layer 40 as long as the tungsten deposition is performed at a temperature lower than about 450° C. to prevent the formation of tungsten silicide. The tungsten overlayer could be replaced by one or more other conductive or dielectric films (e.g. hemi-spherical grained polysilicon or BPSG) with a surface rough enough to result in a plurality of residues or islands on the polysilicon electrode layer 40 after one or more etching steps.

The invention results in the formation of pillars 43 of dimensions smaller than other features on the same wafer. Thus, the polysilicon electrode layer 40 has a large surface area and the capacitance of the resulting capacitor is very large.

Finally, the above-described embodiments of the invention are intended to be illustrative only. Numerous alternative embodiments may be devised by those skilled in the art without departing from the spirit and scope of the following claims.

What is claimed is:

1. A method for forming a capacitor for use in a DRAM cell comprising the steps of:
    a) forming a first polysilicon electrode layer on a silicon substrate,
    b) forming a tungsten overlayer on said substrate having a sufficiently rough surface so that when the tungsten overlayer is etched a plurality of tungsten residual islands are left on the surface of said first polysilicon electrode layer,
    c) etching said tungsten overlayer to form said tungsten residual islands on said polysilicon electrode layer,
    d) etching said polysilicon layer to form a plurality of pillars therein using said tungsten residual islands as a mask,
    e) forming a dielectric layer on said polysilicon electrode layer, and
    f) forming a second polysilicon electrode layer on said dielectric layer.

2. The method of claims 1 wherein said residues have a width of 0.02 to 0.3 microns.

3. The method of claim 1 wherein said tungsten film is formed using chemical vapor deposition.

4. The method of claim 1 wherein said step of forming said overlayer comprises depositing a composite Ti/TiN film on said polysilicon electrode layer and then depositing a tungsten film on said Ti/TiN composite layer.

5. The method of claim 4 wherein said step of etching said overlayer comprises:
    etching said tungsten film to form tungsten residues on the surface of said Ti/TiN composite layer, and
    using said tungsten residues as a mask, etching said composite layer to form said residual islands.

6. The method of claim 1 wherein said step of forming said tungsten overlayer is performed at a temperature of between 380° C. to 600° C.

* * * * *